(12) United States Patent
Kim

(10) Patent No.: US 11,393,524 B2
(45) Date of Patent: Jul. 19, 2022

(54) SEMICONDUCTOR MEMORY AND OPERATING METHOD THEREOF

(71) Applicant: SK hynix Inc., Gyeonggi-do (KR)

(72) Inventor: Jae Woong Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/941,089

(22) Filed: Jul. 28, 2020

(65) Prior Publication Data

US 2021/0272626 A1   Sep. 2, 2021

(30) Foreign Application Priority Data

Mar. 2, 2020   (KR) .................. 10-2020-0026095

(51) Int. Cl.
| | |
|---|---|
| G11C 11/56 | (2006.01) |
| G11C 16/34 | (2006.01) |
| G11C 16/10 | (2006.01) |
| G11C 16/14 | (2006.01) |
| G11C 16/24 | (2006.01) |
| G11C 16/04 | (2006.01) |

(52) U.S. Cl.
CPC ...... *G11C 11/5635* (2013.01); *G11C 11/5628* (2013.01); *G11C 11/5671* (2013.01); *G11C 16/0483* (2013.01); *G11C 16/10* (2013.01); *G11C 16/14* (2013.01); *G11C 16/24* (2013.01); *G11C 16/3445* (2013.01)

(58) Field of Classification Search
CPC .................................................. G11C 11/5635
See application file for complete search history.

(56) References Cited

U.S. PATENT DOCUMENTS

| | | | | |
|---|---|---|---|---|
| 5,995,417 A * | 11/1999 | Chen | ............... | G11C 16/344 |
| | | | | 365/185.12 |
| 2010/0002513 A1* | 1/2010 | Lutze | ............... | G11C 11/5635 |
| | | | | 365/185.17 |
| 2010/0214838 A1* | 8/2010 | Hishida | ............... | G11C 16/14 |
| | | | | 365/185.11 |
| 2014/0029343 A1* | 1/2014 | Yasuda | ............... | G11C 11/5628 |
| | | | | 365/185.17 |
| 2014/0192594 A1* | 7/2014 | Lue | ............... | G11C 16/0483 |
| | | | | 365/185.11 |

FOREIGN PATENT DOCUMENTS

| | | |
|---|---|---|
| KR | 10-2012-0098801 | 9/2012 |
| KR | 10-1264019 | 5/2013 |
| KR | 10-2014-0090553 | 7/2014 |

* cited by examiner

*Primary Examiner* — Douglas King
(74) *Attorney, Agent, or Firm* — IP & T Group LLP

(57) ABSTRACT

There are provided a semiconductor memory and an operating method thereof. The semiconductor memory includes a memory block including a plurality of pages, a peripheral circuit for performing a program operation and an erase operation on a selected page among the plurality of pages, and a control logic for controlling the peripheral circuit to perform the program operation and the erase operation. The control logic decreases threshold voltages of memory cells corresponding to an erase state among a plurality of memory cells included in the selected page in the erase operation.

15 Claims, 12 Drawing Sheets

SEMICONDUCTOR MEMORY AND OPERATING METHOD THEREOF

CROSS-REFERENCE TO RELATED APPLICATION

The present application claims priority under 35 U.S.C. § 119(a) to Korean patent application number 10-2020-0026095, filed on Mar. 2, 2020, which is incorporated herein by reference in its entirety.

BACKGROUND

Field of Invention

The present disclosure generally relates to an electronic device and, more particularly, to a semiconductor memory and an operating method thereof.

Description of Related Art

The paradigm on recent computer environment has been turned into ubiquitous computing environment in which computing systems can be used virtually anywhere and anytime. This promotes increasing usage of portable electronic devices such as mobile phones, digital cameras, notebook computers, and the like. Such portable electronic devices may generally include a memory system using a semiconductor memory, i.e., a data storage device. The data storage device is used as a main memory device or an auxiliary memory device of the portable electronic devices.

A data storage device using a semiconductor memory has excellent stability and durability, high information access speed, and low power consumption, since there is no mechanical driving part. Examples of memory systems having such advantages, include the data storage devices including a Universal Serial Bus (USB) memory device, memory cards having various interfaces, a Solid-State Drive (SSD), and the like.

A semiconductor memory is generally classified into a volatile memory device and a nonvolatile memory device.

A nonvolatile memory device has relatively slow write and read speeds, but retains stored data even when the supply of power is interrupted. Thus, a nonvolatile memory device is typically used to store data which must be retained regardless of whether power is supplied.

Examples of a volatile memory include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. A flash memory may be classified into a NOR type flash memory or a NAND type flash memory.

SUMMARY

Various embodiments of the present invention provide a semiconductor memory having improved data reliability and an operating method of the semiconductor memory.

In accordance with an aspect of the present disclosure, there is provided a semiconductor memory including: a memory block including a plurality of pages; a peripheral circuit configured to perform a program operation and an erase operation on a selected page among the plurality of pages; and a control logic configured to control the peripheral circuit to perform the program operation and the erase operation, wherein the control logic decreases threshold voltages of memory cells corresponding to an erase state among a plurality of memory cells included in the selected page in the erase operation.

In accordance with another aspect of the present disclosure, there is provided a method for operating a semiconductor memory, the method including: performing a program operation on a selected page among a plurality of pages; and performing an erase operation of selectively erasing selected memory cells corresponding to an erase state among a plurality of memory cells included in the selected page, wherein, in the performing of the erase operation, an erase voltage is applied to bit lines of the selected memory cells corresponding to the erase state, based on data to be programmed in the program operation.

In accordance with still another aspect of the present disclosure, there is provided a method for operating a semiconductor memory, the method including: receiving data to be programmed from outside and storing the data in a plurality of page buffers; controlling potential levels of a plurality of bit lines, based on the data stored in the plurality of page buffers; performing a program operation on a plurality of memory cells included in a selected page among a plurality of pages by applying a program voltage to a word line corresponding to the selected page; and decreasing a threshold voltage distribution of memory cells corresponding to an erase state by applying an erase voltage to selected bit lines corresponding to the memory cells corresponding to the erase state among a plurality of bit lines, based on the data stored in the plurality of page buffers.

In accordance with an aspect of the present disclosure, there is provided a memory device including: a page including cells respectively coupled to bit lines; and an operational circuit configured to: perform an operation of programming each of the cells to have one among an erase state and one or more program states based on program data; and apply, among the bit lines, an erase voltage to one or more bit lines coupled to cells to have the erase state and an erase inhibit voltage to one or more bit lines coupled to remaining cells, among the cells.

These and other features and advantages of the present invention will become better understood from the following detailed description of specific embodiments in reference to the following figures.

BRIEF DESCRIPTION OF THE DRAWINGS

Example embodiments will now be described more fully hereinafter with reference to the accompanying drawings; however, the example embodiments may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it may be the only element between the two elements, or one or more intervening elements may also be present. Like reference numerals refer to like elements throughout.

DETAILED DESCRIPTION

The specific structural or functional description disclosed herein is merely illustrative for the purpose of describing various embodiments of the present disclosure. Various embodiments of the disclosure may be implemented in various forms, and should not be construed as limited to the embodiments set forth herein.

Hereinafter, various embodiments of the present disclosure will be described in detail with reference to the accompanying drawings in order for those skilled in the art to be able to readily implement the technical spirit of the present disclosure.

Figure 1:
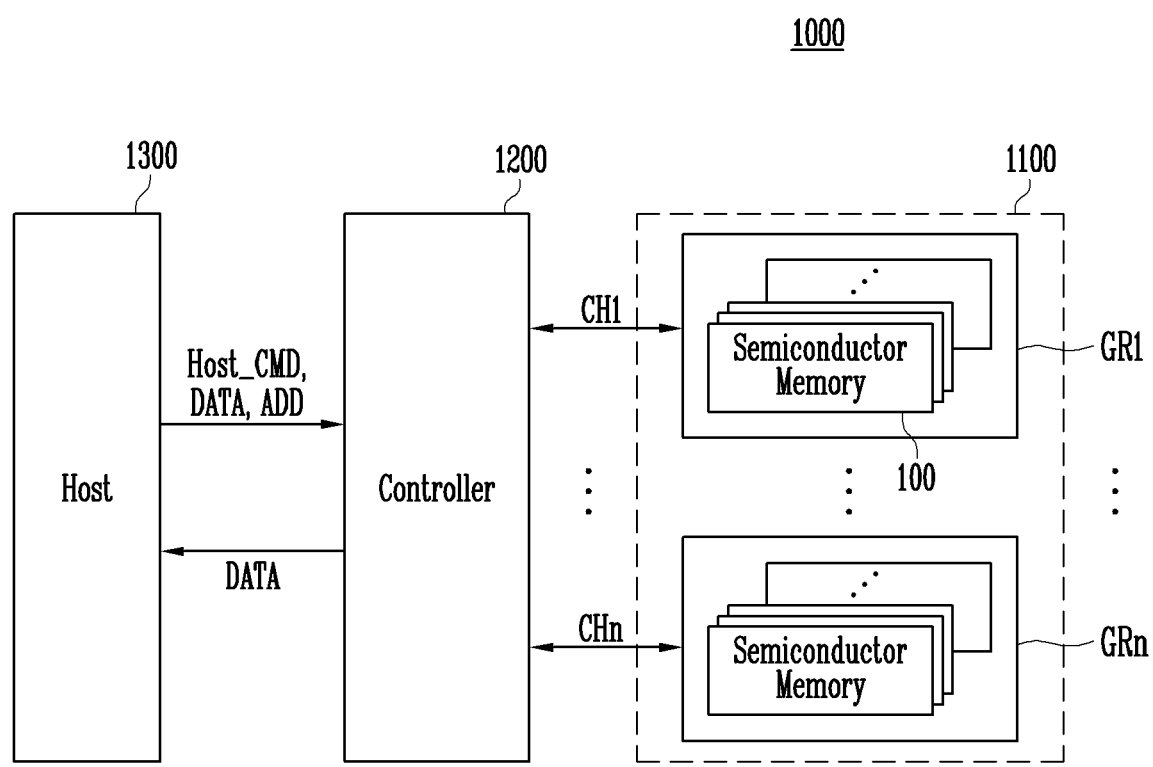
FIG. 1 is a block diagram illustrating a memory system including a memory device in accordance with an embodiment of the present disclosure.

FIG. 1 is a block diagram illustrating a memory system 1000 in accordance with an embodiment of the present disclosure.

Referring to FIG. 1, the memory system 1000 may include a memory device 1100, a controller 1200, and a host 1300. The memory device 1100 may include a plurality of semiconductor memories 100. The plurality of semiconductor memories 100 may be divided into a plurality of groups GR1 to GRn. Although a case where the host 1300 is included in the memory system 1000 is illustrated and described in the embodiment of the present disclosure, the memory system 1000 may be configured in various other ways. For example, the memory system 1000 may include only the controller 1200 and the memory device 1100, and the host 1300 may be disposed at the outside of the memory system 1000.

In FIG. 1, a case where the plurality of groups GR1 to GRn of the memory device 1100 communicate with the controller 1200 respectively through first to nth channels CH1 to CHn is illustrated. Each semiconductor memory 100 will be described later with reference to FIG. 2.

Each of the plurality of groups GR1 to GRn may communicate with the controller 1200 through one common channel. The controller 1200 may control the plurality of semiconductor memories 100 of the memory device 1100 through the plurality of channels CH to CHn.

In an embodiment of the present disclosure, when the plurality of semiconductor memories 100 in the memory device 1100 receive a command corresponding to a program operation, the plurality of semiconductor memories 100 may perform the program operation in unit of a page and then perform an erase operation on memory cells corresponding to an erase state, which are included in a page on which the program operation has been completed. A program disturb phenomenon in which a threshold voltage distribution increases in the program operation may occur in the memory cells corresponding to the erase state, but the erase operation may be selectively performed on only the memory cells corresponding to the erase state after the program operation is completed, so that the threshold voltage distribution of the memory cells can be improved.

In an embodiment, the controller 1200 may be coupled to the host 1300 and the memory device 1100. The controller 1200 may access the memory device 1100 in response to a request from the host 1300. For example, the controller 1200 may control various operations such as read, program, erase, and background operations of the memory device 1100 in response to a host command Host_CMD received from the host 1300. In a program operation, the host 1300 may transmit an address ADD and data DATA to be programmed together with the host command Host_CMD. In a read operation, the host 1300 may transmit an address ADD together with the host command Host_CMD. In a program operation, the controller 1200 may transmit a command corresponding to the program operation and data DATA to be programmed to the memory device 1100. In a read operation, the controller 1200 may transmit a command corresponding to the read operation to the memory device 1100, receive read data DATA from the memory device 1100, and transmit the received data DATA to the host 1300. The controller 1200 may provide an interface for the memory device 1100 and the host 1300. The controller 1200 may drive firmware for controlling the memory device 1100.

The host 1300 may include portable electronic devices such as a computer, a PDA, a PMP, an MP3 player, a camera, a camcorder, and a mobile phone. The host 1300 may request a program operation, a read operation, an erase operation, etc. of the memory system 1000 through a host command Host_CMD. For the purpose of a program operation, the host 1300 may transmit a host command Host_CMD corresponding to the program operation, data DATA, and an address ADD to the controller 1200. For the purpose of a read operation, the host may transmit a host command Host_CMD corresponding to the read operation and an address ADD to the controller 1200. The address ADD may be a logical address block of data.

The controller 1200 and the memory device 1100 may be integrated into one semiconductor memory. In an embodiment, the controller 1200 and the memory device 1100 may be integrated into one semiconductor memory, to constitute a memory card. For example, the controller 1200 and the memory device 1100 may be integrated into one semiconductor memory, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD card (SD, miniSD, microSD or SDHC), or a Universal Flash Storage (UFS).

In another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multi-Media Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the memory device 1100 or the memory system 1000 may be packaged in various forms. For example, the memory device 1100 or the memory system 1000 may be packaged as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), Plastic Metric Quad Flat Pack (PMQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 2:
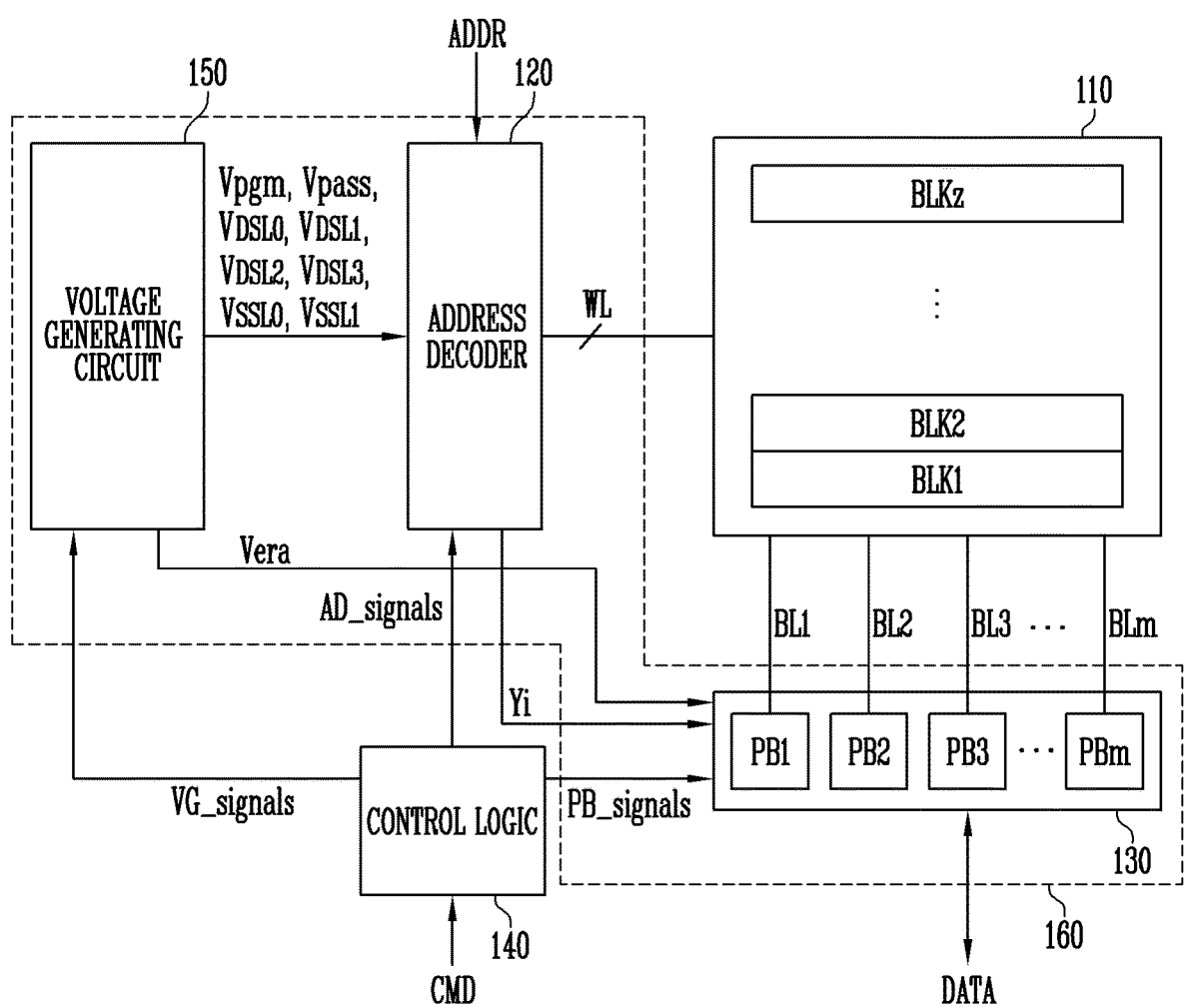
FIG. 2 is a diagram illustrating a configuration example of a semiconductor memory included in the memory device shown in FIG. 1.

FIG. 2 is a diagram illustrating a configuration example of the semiconductor memory 100 included in the memory device shown in FIG. 1.

The semiconductor memory 100 in accordance with an embodiment of the present disclosure may perform a program operation on a selected page when the semiconductor memory 100 receives a command CMD corresponding to the program operation from the controller 1200 shown in FIG. 1. The semiconductor memory 100 may selectively perform an erase operation on memory cells corresponding to an erase state among memory cells included in the selected page after the program operation on the selected page is completed.

Referring to FIG. 2, the semiconductor memory 100 may include a memory cell array 110, an address decoder 120, a read/write circuit 130, a control logic 140, and a voltage generating circuit 150. The address decoder 120, the read/write circuit 130, and the voltage generating circuit 150 may be defined as a peripheral circuit 160 which performs a read operation on the memory cell array 110.

The memory cell array 110 may include a plurality of memory blocks BLK1 to BLKz. The plurality of memory blocks BLK1 to BLKz may be coupled to the address decoder 120 through word lines WL. The plurality of memory blocks BLK1 to BLKz may be coupled to the read/write circuit 130 through bit lines BL1 to BLm. Each of the plurality of memory blocks BLK1 to BLKz may include a plurality of memory cells. In an embodiment, the plurality of memory cells may be nonvolatile memory cells. A plurality of memory cells coupled to one word line among the plurality of memory cells may be defined as one page. That is, the memory cell array 110 may be configured with a plurality of pages.

Each of the plurality of memory blocks BLK1 to BLKz of the memory cell array 110 may include a plurality of memory strings. Each of the plurality of memory strings may include a drain select transistor, a plurality of memory cells, and a source select transistor, which are coupled in series between a bit line and a source line. Also, each of the plurality of memory strings may include a pass transistor between the source select transistor and the memory cells, and a pass transistor between the drain select transistor and the memory cells, and may further include a pipe gate transistor between the memory cells. The memory cell array 110 will be described in detail later.

The address decoder 120 may be coupled to the memory cell array 110 through the word lines WL. The address decoder 120 may operate in response to address decoder control signals AD_signals generated by the control logic 140. The address decoder 120 may receive an address ADDR through an input/output buffer (not shown) in the semiconductor memory 100.

The address decoder 120 may decode a row address in the received address ADDR, and may apply a plurality of operation voltages, for example, a program voltage Vpgm, a pass voltage Vpass, a plurality of drain select line voltages $V_{DSL0}$, $V_{DSL1}$, $V_{DSL2}$, and $V_{DSL3}$, and a plurality of source select line voltage $V_{SSL0}$ and $V_{SSL1}$, which are generated by the voltage generating circuit 150 during the program operation, to a plurality of memory cells, drain select transistors, and source select transistors of the memory cell array 110 according to the decoded row address.

In an erase operation on memory cells corresponding to an erase state, which are included in a selected page on which a program operation has been completed, the address decoder 120 may apply an erase operation voltage (e.g., a ground voltage) to a selected word line, and apply a pass voltage generated in the voltage generating circuit 150 to unselected word lines. The address decoder 120 may control drain select lines of a selected memory block to be in an erase operation state (e.g., a floating state).

The address decoder 120 may decode a column address in the received address ADDR. The address decoder 120 may transmit the decoded column address Yi to the read/write circuit 130.

An address ADDR received in the program operation may include a block address, a row address, and a column address. The address decoder 120 may select one memory block and one word line according to the block address and the row address. The column address may be decoded by the address decoder 120 to be provided to the read/write circuit 130.

The address decoder 120 may include a block decoder, a row decoder, a column decoder, an address buffer, and the like.

The read/write circuit 130 may include a plurality of page buffers PB1 to PBm. The plurality of page buffers PB1 to PBm may be coupled to the memory cell array 110 through the bit lines BL1 to BLm. The plurality of page buffers PB1 to PBm may temporarily store data DATA to be programmed, which is received from the controller 1200 shown in FIG. 2, in the program operation, and control voltage levels of the bit lines BL1 to BLm according to the temporarily stored data DATA.

In the erase operation on the memory cells corresponding to the erase state, which are included in the selected page on which the program operation has been completed, the read/write circuit 130 may apply an erase voltage Vera to bit lines coupled to the memory cells corresponding to the erase state among the bit line BL1 to BLm. For example, the plurality of page buffers PB1 to PBm of the read/write circuit 130 may apply the erase voltage Vera or an erase inhibit voltage (e.g., a ground voltage) to a corresponding bit line according to the temporarily stored data DATA in the program operation. The erase voltage Vera may be provided from the voltage generating circuit 150.

The read/write circuit 130 may operate in response to page buffer control signals PB_signals output from the control logic 140.

In an embodiment, the read/write circuit 130 may include page buffers (or page registers), a column select circuit, and the like.

The control logic 140 may be coupled to the address decoder 120, the read/write circuit 130, and the voltage generating circuit 150. The control logic 140 may receive a command CMD through the input/output buffer (not shown) of the semiconductor memory 100. The control logic 140 may control a general operation of the semiconductor memory 100 in response to the command CMD. For example, the control logic 140 may receive a command CMD corresponding to a write command, and generate and output address decoder control signals AD_signals for controlling the address decoder 120, page buffer control signals PB_signals to control the read/write circuit 130, and voltage generating circuit control signals VG_signals to control the voltage generating circuit 150 in response to a received command CMD.

When the control logic 140 in accordance with an embodiment of the present disclosure receives a command CMD corresponding to a program operation, the control logic 140 may control the peripheral circuit 160 to perform the program operation on a selected memory block, and control the peripheral circuit 160 to selectively perform an erase operation on memory cells corresponding to an erase state among memory cells included in a selected page after the program operation on the selected page is completed in the program operation on the selected memory block.

In the program operation, the voltage generating circuit 150 may generate a plurality of operation voltages, for example, a program voltage Vpgm, a pass voltage Vpass, a plurality of drain select line voltages $V_{DSL0}$, $V_{DSL1}$, $V_{DSL2}$, and $V_{DSL3}$, and a plurality of source select line voltages $V_{SSL0}$ and $V_{SSL1}$, and output the plurality of operation voltages to the address decoder 120, according to the voltage generating circuit control signals VG_signals output from the control logic 140. Also, when the erase operation on the memory cells corresponding to the erase state of the selected page after the program operation on the selected page is completed, the voltage generating circuit 150 may generate an erase voltage Vera and then transmit the erase voltage Vera to the read/write circuit 130, and generate a pass voltage Vpass and then transmit the pass voltage Vpass to the address decoder 120.

Figure 3:
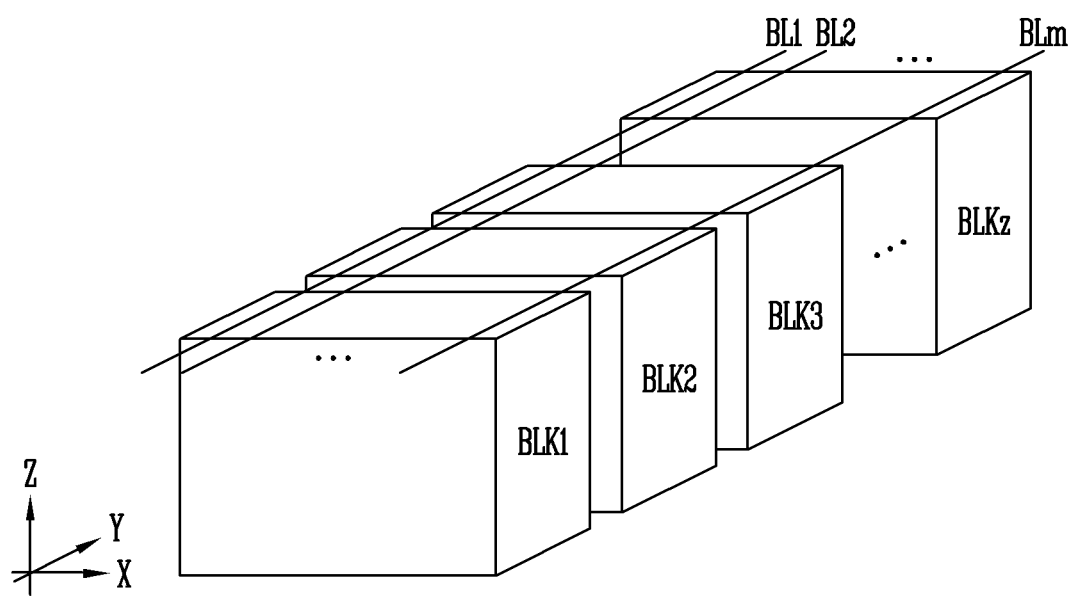
FIG. 3 is a diagram illustrating three-dimensionally configured memory blocks.

FIG. 3 is a diagram illustrating three-dimensionally configured memory blocks.

Referring to FIG. 3, the three-dimensionally configured memory blocks BLK1 to BLKz may be arranged spaced apart from each other along a direction Y in which bit lines BL1 to BLm extend. For example, first to zth memory blocks BLK1 to BLKz may be arranged spaced apart from each other along a second direction Y, and include a plurality of memory cells stacked along a third direction Z. A configuration of any one memory block among the first to zth memory blocks BLK1 to BLKz will be described in detail with reference to FIGS. 4 and 5.

Figure 4:
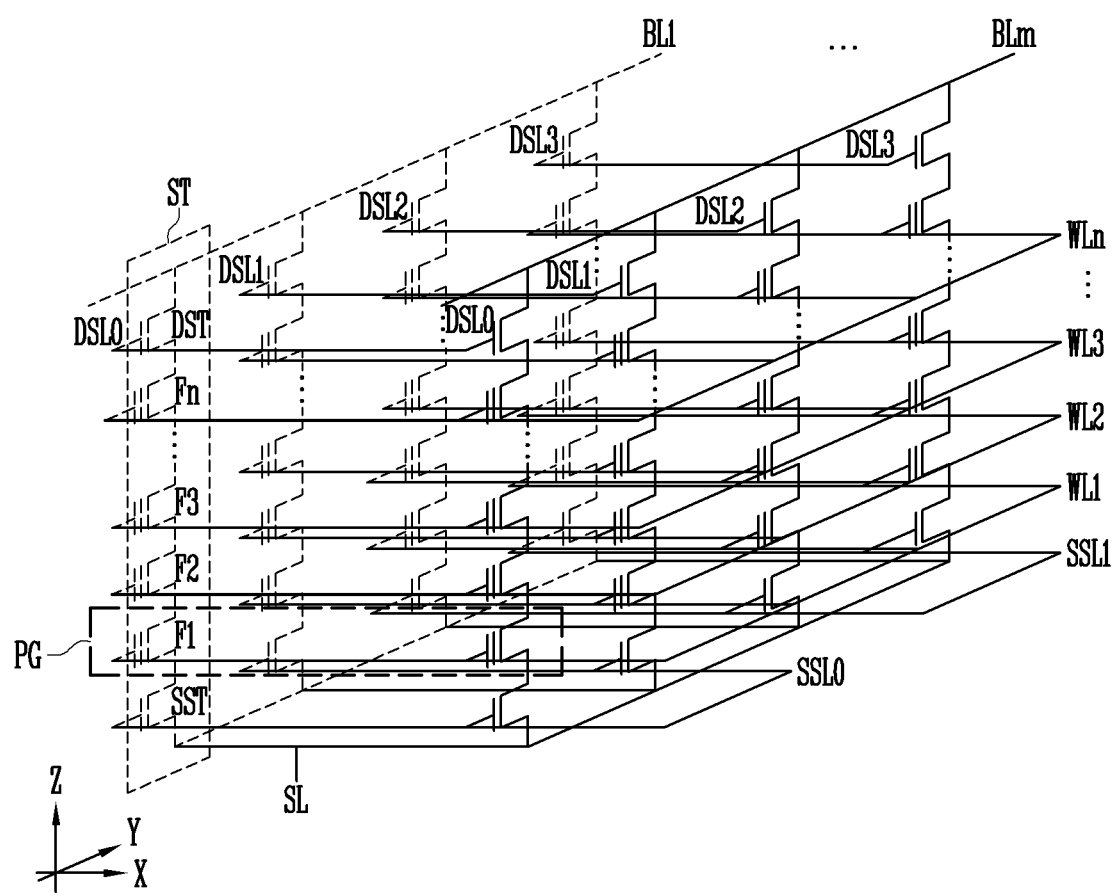
FIG. 4 is a circuit diagram illustrating an example of a configuration of any one memory block shown in FIG. 3.

FIG. 4 is a circuit diagram illustrating in detail any one memory block shown in FIG. 3.

Figure 5:
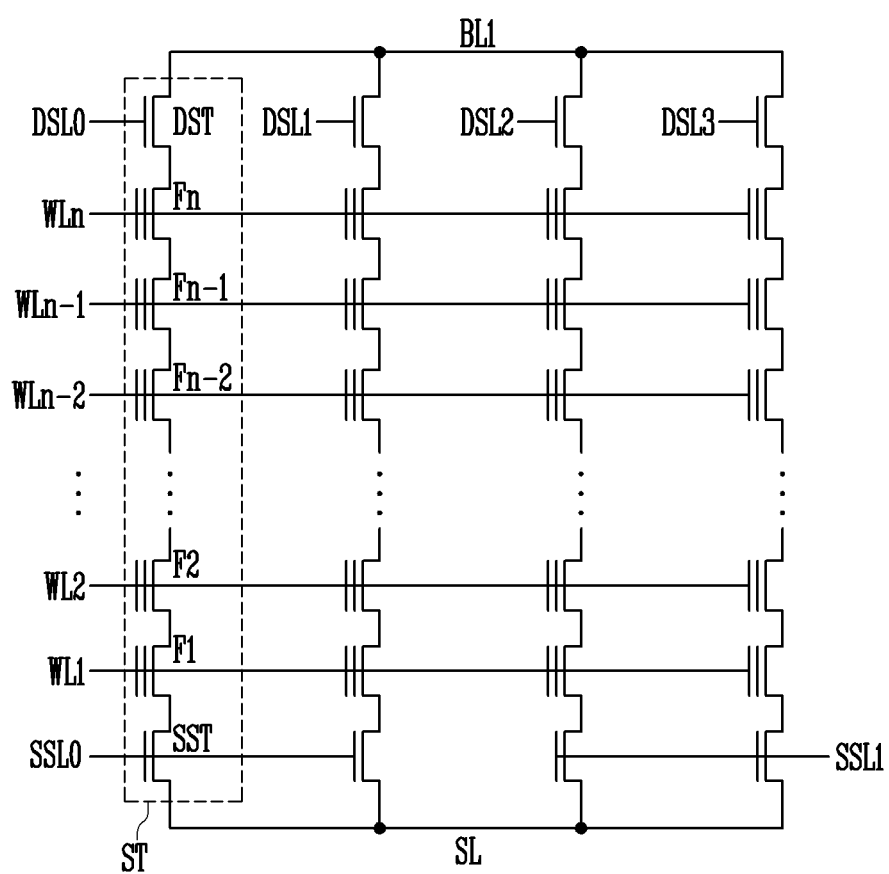
FIG. 5 is a circuit diagram illustrating memory strings shown in FIG. 4.

FIG. 5 is a circuit diagram illustrating memory strings shown in FIG. 4.

Referring to FIGS. 4 and 5, each memory string ST may be coupled between a corresponding bit line among bit lines BL1 to BLm and a source line SL. A memory string ST coupled between a first bit line BL1 and the source line SL will be described as an example.

The memory string ST may include a source select transistor SST, memory cells F1 to Fn where n is a positive integer, and a drain select transistor DST, which are coupled in series between the source line SL and the first bit line BL1. Gates of source select transistors SST included in different memory strings ST coupled to different bit lines BL1 to BLm may be coupled to a first source select line SSL0 and be coupled to a second source select line SSL1. In an example, source select transistors adjacent to each other in the second direction Y among the source select transistors SST may be coupled to the same source select line. For example, when source select transistors SST are sequentially arranged along the second direction Y, gates of source select transistors SST which are arranged in a first direction X from a first source select transistor SST and are included in different strings ST, and gates of source select transistors SST which are arranged in the first direction X from a second source select transistor SST and are included in different strings ST may be coupled to the first source select line SSL0. In addition, gates of source select transistors SST which are arranged in the first direction X from a third source select transistor SST and are included in different strings ST, and gates of source select transistors SST which are arranged in the first direction X from a fourth source select transistor SST and are included in different strings ST may be coupled to the second source select line SSL1.

Gates of the memory cells F1 to Fn may be coupled to word lines WL1 to WLn, and gates of drain select transistors DST may be coupled to any one of first to fourth drain select lines DSL0 to DSL3.

Gates of transistors arranged in the first direction X among the drain select transistors DST are commonly coupled to the same drain select line (e.g., DSL0), but transistors arranged in the second direction Y may be coupled to different drain select lines DSL1 to DSL3. For example, when drain select transistors DST are sequentially arranged along the second direction Y, gates of drain select transistors DST which are arranged in the first direction X from a first drain select transistor DST and are included in different strings ST may be coupled to the first drain select line DSL0. Drain select transistors DST arranged in the second direction Y from the drain select transistors DST coupled to the first drain select line DSL0 may be sequentially coupled to the second to fourth drain select lines DSL1 to DSL3. Therefore, in a selected memory block, memory strings ST coupled to a selected drain select line may be selected, and memory strings ST coupled to unselected drain selected lines may be unselected.

Memory cells coupled to the same word line may constitute one page PG. The page may mean a physical page. For example, a group of memory cells coupled in the first direction X on the same word line among the strings ST coupled to the first bit line BL1 to an mth bit line BLm is referred to as a page PG. For example, memory cells arranged in the first direction X among first memory cells F1 coupled to a first word line WL1 may constitute one page PG. Memory cells arranged in the second direction Y among the first memory cells F1 commonly coupled to the first word line WL1 may constitute another page. Therefore, when the first drain select line DSL0 is a selected drain line and the first word line WL1 is a selected word line, a page coupled to the first drain select line DSL0 among a plurality of pages PG coupled to the first word line WL1 becomes a selected page. Pages which are commonly coupled to the first word line WL1 but are coupled to the unselected second to fourth drain select lines DSL1 to DSL3 become unselected pages.

Although a case where one source select transistor SST and one drain select transistor DST are included in one string ST is illustrated in the drawings, a plurality of source select transistors SST and a plurality of drain select transistors DST may be included in one string ST, depending on a semiconductor memory. In addition, dummy cells may be included between the source select transistor SST, the memory cells F1 to Fn, and the drain select transistor DST, depending on a semiconductor memory. The dummy cells do not store user data, like general memory cells F1 to Fn, but may be used to improve electrical characteristics of each string ST. However, the dummy cells are not important components in this embodiment, and therefore, their detailed descriptions will be omitted.

Figure 6:
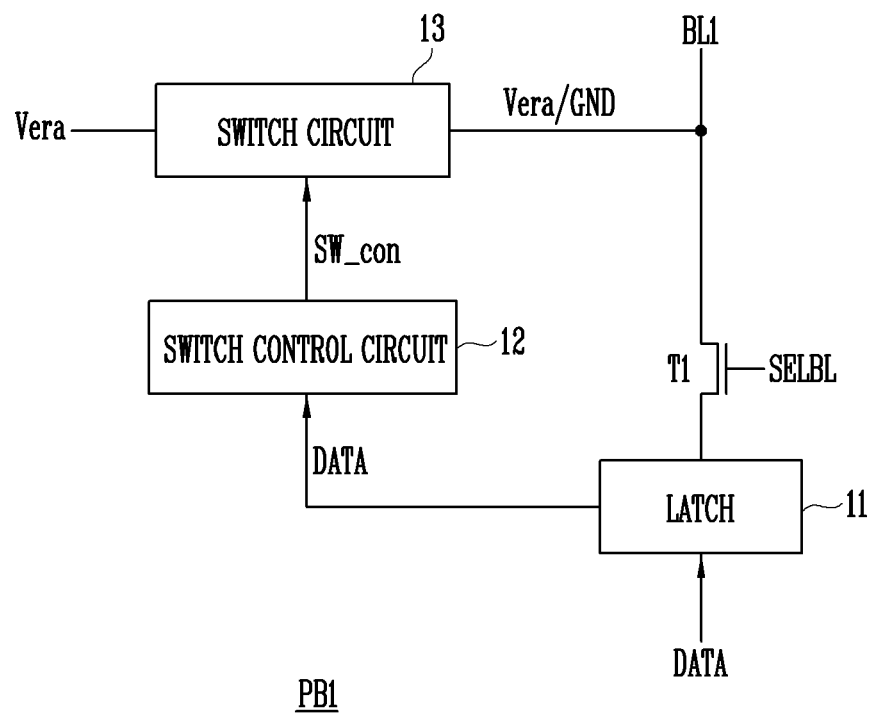
FIG. 6 is a diagram illustrating an example of a page buffer shown in FIG. 2.

FIG. 6 is a diagram illustrating a configuration example of a page buffer shown in FIG. 2.

The page buffers PB1 to PBm shown in FIG. 2 may be configured with structures similar to each other, and the page buffer PB1 will be described as an example for convenience of description.

Referring to FIG. 6, the page buffer PB1 may include a latch 11, a switch control circuit 12, a switch circuit 13, and a transistor T1.

The latch 11 may receive and store data DATA to be programmed. The latch 11 may be electrically coupled to the bit line BL1 through the transistor T1 in a program operation, and control a corresponding potential level of the bit line BL1 as a program allow voltage (e.g., a ground voltage) or a program inhibit voltage (e.g., a power voltage) according to the stored data DATA.

The latch 11 may transmit the stored data DATA to the switch control circuit 12 in an erase operation on memory cells corresponding to an erase state, which are included in a selected page, after a program operation on the selected page is completed.

The switch control circuit 12 may generate and output a switch control signal SW_con for controlling the switch circuit 13 according to the data DATA received from the latch 11. For example, in the erase operation on the memory cells corresponding to the erase state, which are included in the selected page, the switch control circuit 12 may generate and output the switch control signal SW_con having a first logic level, when the data DATA received from the latch 11 is data corresponding to the erase state. The switch control circuit 12 may generate and output the switch control signal SW_con having a second logic level when the data DATA received from the latch 11 is data corresponding to any one of a plurality of program states.

The switch circuit 13 may apply an erase voltage Vera or an erase inhibit voltage (e.g., a ground voltage GND) to the corresponding bit line BL1 in response to the switch control signal SW_con. For example, when the switch circuit 13 receives the switch control signal SW_con having the first logic level in the erase operation on the memory cells corresponding to the erase state, which are included in the selected page, the switch circuit 13 may apply the erase voltage Vera received from the voltage generating circuit 150 shown in FIG. 2 to the bit line BL1. Also, when the switch circuit 13 receives the switch control signal SW_con having the second logic level in the erase operation on the memory cells corresponding to any one of the program states, which are included in the selected page, the switch circuit 13 may apply the erase inhibit voltage (e.g., GND) to the bit line BL1.

The transistor T1 may be coupled between the latch 11 and the bit line BL1, and electrically connect the latch 11 and the bit line BL1 in response to a bit line select signal SELBL in the program operation.

Figure 7:
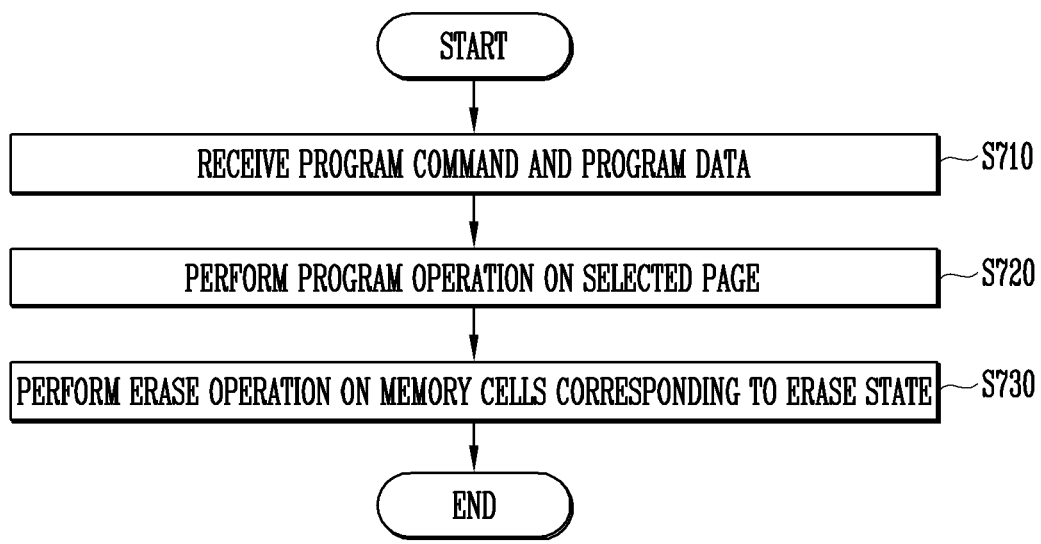
FIG. 7 is a flowchart of an operating method of the semiconductor memory in accordance with an embodiment of the present disclosure.

FIG. 7 is a flowchart of an operating method of the semiconductor memory in accordance with an embodiment of the present disclosure.

Figure 8:
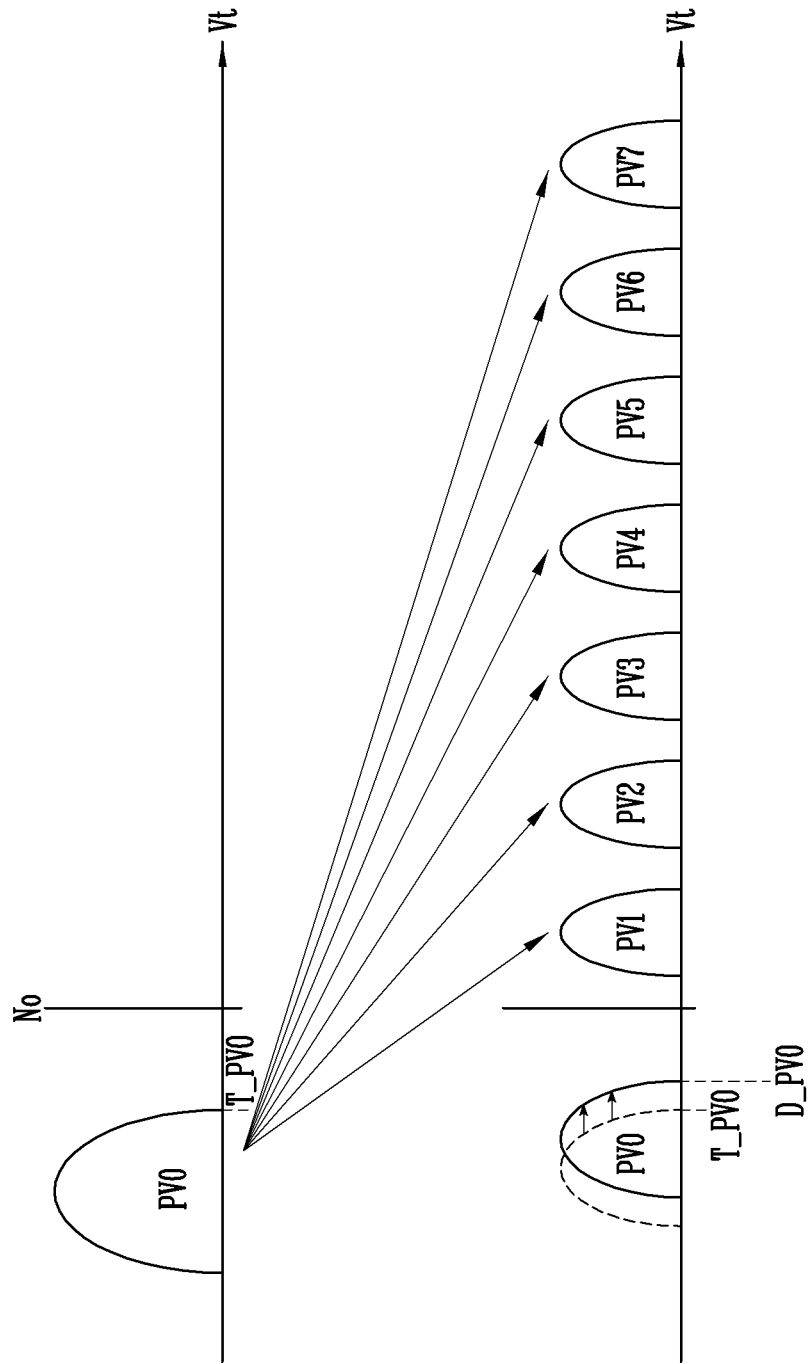
FIG. 8 is a threshold voltage distribution diagram illustrating a change in threshold voltage distribution after a program operation on a memory block in an erase state.

FIG. 8 is a threshold voltage distribution diagram illustrating a change in threshold voltage distribution after a program operation on a memory block in an erase state.

Figure 9:
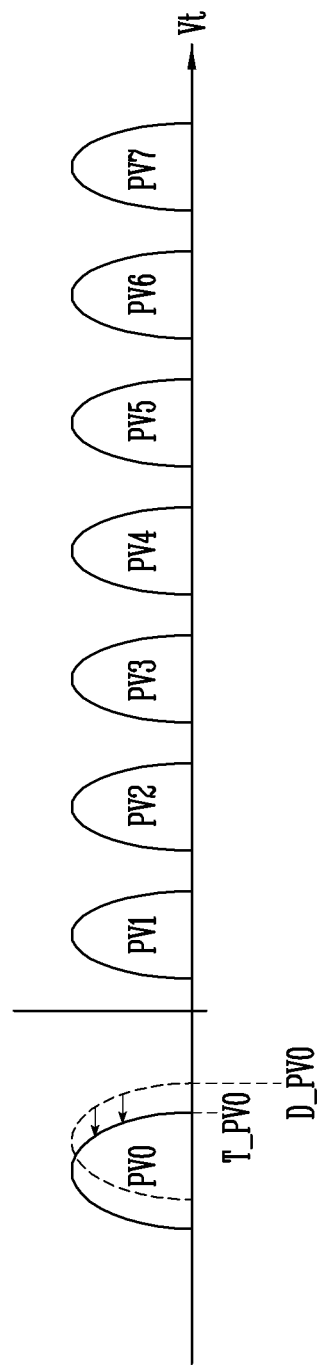
FIG. 9 is a threshold voltage distribution diagram illustrating an erase operation on memory cells in the erase state after the program operation.

FIG. 9 is a threshold voltage distribution diagram illustrating an erase operation on memory cells in the erase state after the program operation.

The operating method of the semiconductor memory in accordance with the embodiment of the present disclosure will be described as follow with reference to FIGS. 1 to 9.

In an embodiment, the semiconductor memory 100 may receive a command CMD corresponding to a program operation and data DATA to be programmed from the outside (e.g., the controller 1200 shown in FIG. 1) (S710). The semiconductor memory 100 may receive an address ADDR together with the command CMD and the data DATA to be programmed.

The semiconductor memory 100 may perform the program operation on a selected page PG of a selected memory block (e.g., BLK1) in response to the command corresponding to the program operation (S720).

For example, the plurality of page buffers PB1 to PBm included in the read/write circuit 130 may receive and temporarily store the data DATA to be programmed in response to the page buffer control signals PB_signals output from the control logic 140, and respectively control potentials of corresponding bit lines BL1 to BLm. The voltage generating circuit 150 may generate a program voltage Vpgm in response to the voltage generating circuit control signals VG_signals output from the control logic 140. Among the plurality of drain select line voltages $V_{DSL0}$, $V_{DSL1}$, $V_{DSL2}$, and $V_{DSL3}$, the voltage generating circuit 150 may generate any one drain select line voltage corresponding to the selected page PG to have a turn-on voltage level (e.g., a pass voltage level) and remaining drain select line voltages to have a turn-off voltage level (e.g., a ground voltage level). Among the plurality of source select line voltages $V_{SSL0}$ and $V_{SSL1}$, the voltage generating circuit 150 may generate any one source select line voltage corresponding to the selected page PG to have a turn-on voltage level (e.g., a pass voltage level) and remaining source select line voltages to have a turn-off voltage level (e.g., a ground voltage level). The address decoder 120 may apply the program voltage Vpgm to a word line corresponding to the selected page PG of the selected memory block BLK1 and applies a pass voltage Vpass to unselected word lines, in response to the address decoder control signals AD_signals generated in the control logic 140 and the address ADDR. Also, the address decoder 120 may apply the plurality of drain select line voltages $V_{DSL0}$, $V_{DSL1}$, $V_{DSL2}$, and $V_{DSL3}$ respectively to the drain select lines DSL0 to DSL3 of the selected memory block BLK1, and apply the plurality of source select line voltages $V_{SSL0}$ and $V_{SSL1}$ respectively to the source select lines SSL0 and SSL1 of the selected memory block BLK1.

Referring to FIG. 8, the memory cells in the selected page may have a threshold voltage distribution of an erase state PV0 before the program operation. The memory cells may be programmed to have threshold voltage distributions corresponding to the erase state PV0 and a plurality of program states PV1 to PV7 according to the program operation. The threshold voltage distribution of memory cells corresponding to the erase state PV0 may increase since a program disturb phenomenon occurs due to the program operation of memory cells corresponding to the program states PV1 to PV7. For example, the memory cells corresponding to the erase state PV0 may have a threshold voltage lower than a target threshold voltage T_PV0 before the program operation. The threshold voltage distribution of the memory cells corresponding to the erase state PV0 may increase due to the program disturb phenomenon in the program operation, and therefore, the threshold voltage distribution of some memory cells may have a threshold voltage which is higher than the target threshold voltage T_PV0 and is lower than a disturb threshold voltage D_PV0.

When the program operation on the selected page PG is completed, the control logic 130 may perform an erase operation on the memory cells corresponding to the erase state PV0 by controlling the peripheral circuit 160 (S730). The data DATA to be programmed, which is received in the program operation, may remain temporarily stored in the plurality of page buffers PB1 to PBm of the read/write circuit 130. A page buffer in which data DATA corresponding to the erase state PV0 is stored among the plurality of page buffers PB1 to PBm may decrease the threshold voltage of the memory cells corresponding to the erase state PV0 by performing an erase operation of applying the erase voltage Vera to a corresponding bit line.

Referring to FIG. 9, when the program operation on the selected page PG is completed, the memory cells corresponding to the erase state PV0 may have a threshold voltage lower than the disturb threshold voltage distribution D_PV0. Subsequently, when the selective erase operation may be performed on the memory cells corresponding to the erase state PV0, the threshold voltage of the memory cells corresponding to the erase state PV0 may be decreased to have a threshold voltage lower than the target threshold voltage T_PV0.

Figure 10:
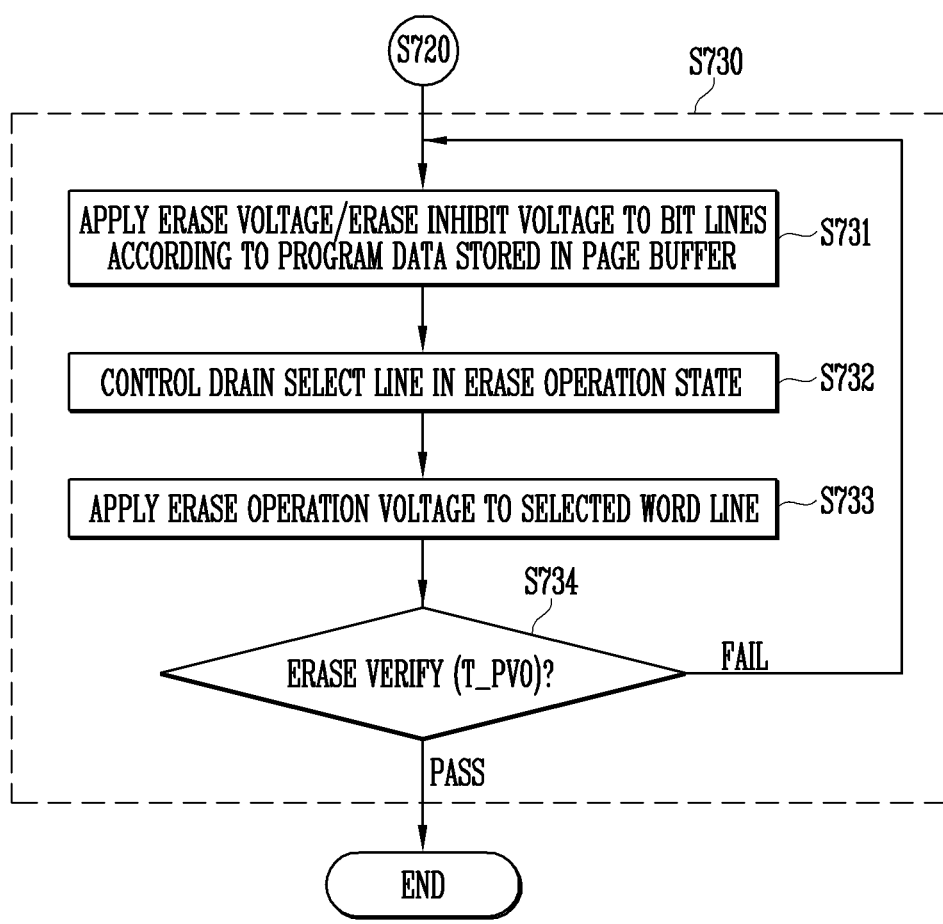
FIG. 10 is a flowchart describing operation S730 shown in FIG. 7.

FIG. 10 is a flowchart illustrating the operation S730 shown in FIG. 7.

Figure 11:
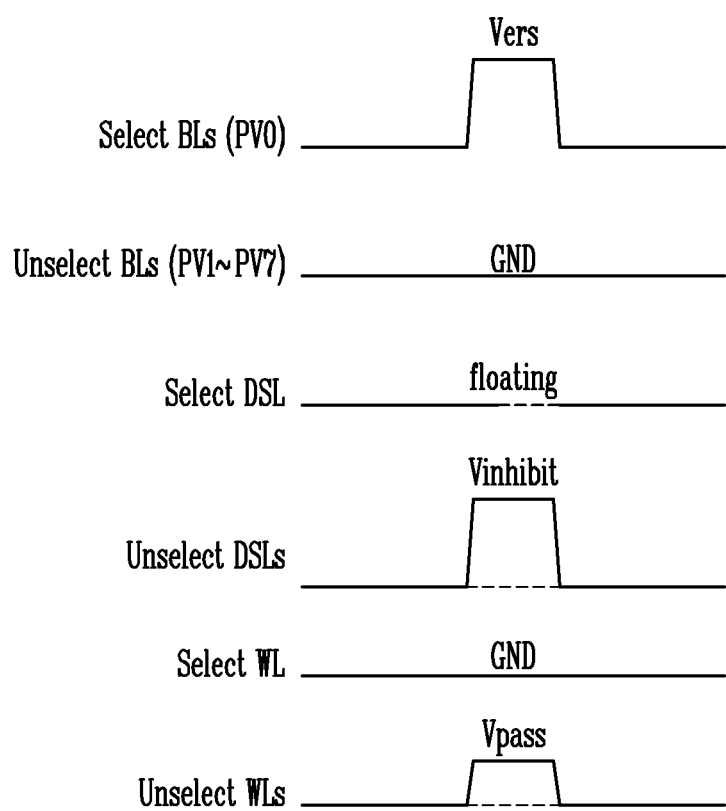
FIG. 11 is a waveform diagram describing operation S730 shown in FIG. 7.

FIG. 11 is a waveform diagram illustrating the operation S730 shown in FIG. 7.

Referring to FIGS. 10 and 11, the above-described operation of S730 will be described in more detail as follows.

In an embodiment, the data to be programmed, which is received in the program operation, may remain temporarily stored in the plurality of page buffers in the previous operation S720 of performing the program operation. Page buffers storing data corresponding to the erase state PV0 among the plurality of page buffers may apply the erase voltage Vera to corresponding selected bit lines Select BLs, and page buffers storing data corresponding to the program states PV1 to PV7 among the plurality of page buffers may apply the erase inhibit voltage GND to corresponding bit lines Unselect BLs (S731).

A selected drain select line Select DSL among the plurality of drain select lines of the selected memory block may be controlled in an erase operation state (S732). For example, a Gate Induced Drain Leakage (GIDL) current may be generated in a lower channel of drain select transistors each having a gate coupled to the selected drain select line Select DSL and a drain coupled to the selected bit lines Select BLs according to a potential level difference between the gate and the drain, and hot holes may be generated by the GIDL current to be supplied into a channel of a corresponding memory string. An erase inhibit voltage Vinhibit may be applied to unselected drain select lines Unselect DSLs to prevent current generation. Also, the unselected drain select lines Unselect DSLs may be controlled to be floated.

Subsequently, the selected drain select line Select DSL is controlled to be floated.

When the ground voltage GND is applied to a selected word line Select WL corresponding to the selected page, electrons trapped in a charge storage layer of the memory cells corresponding to the erase state PV0 may be discharged to the channel by the hot holes introduced into the channel, and therefore, the threshold voltage may be decreased. The pass voltage Vpass may be applied to unselected word lines Unselect WLs to prevent a threshold voltage of memory cells included in another page from being decreased (S733). Also, the unselected word lines Unselect WLs may be controlled to be floated.

Subsequently, an erase verify operation may be performed to check whether the threshold voltage of the memory cells corresponding to the erase state, which are included in the selected page, is lower than the target threshold voltage T_PV0 (S734).

As a result of the erase verify operation, when a threshold voltage of some memory cells among the memory cells corresponding to the erase state is higher than the target threshold voltage T_PV0 (FAIL), the semiconductor memory may re-perform the above-described operations from the S731 by setting the erase voltage Vrea to be applied to bit lines corresponding to the some memory cells. The erase inhibit voltage may be set to be applied to bit lines corresponding to the memory cells of which threshold voltage is lower than the target threshold voltage T_PV0 among the memory cells corresponding to the erase state.

As a result of the erase verify operation, when the threshold voltage of the memory cells corresponding to the erase state is lower than the target threshold voltage T_PV0 (PASS), the erase operation on the memory cells corresponding to the erase state, which are included in the selected page, may be ended.

As described above, in accordance with an embodiment of the present disclosure, although the threshold voltage of the memory cells corresponding to the erase state increases due to the program disturb phenomenon in the program operation, the selective erase operation for decreasing the threshold voltage of the memory cells corresponding to the erase state may be performed, so that the threshold voltage distribution of the memory cells can be improved.

Figure 12:
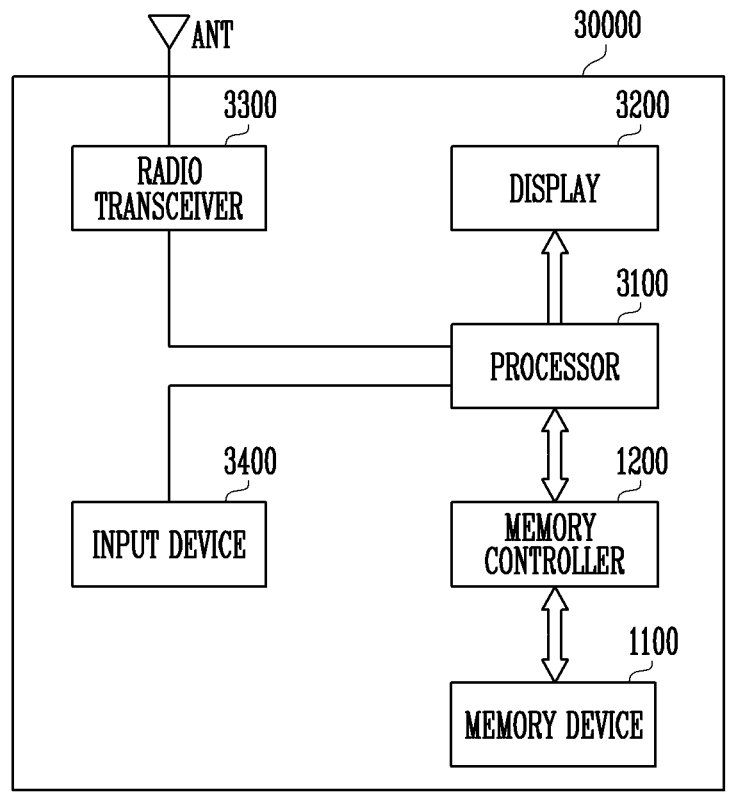
FIG. 12 is a diagram illustrating another embodiment of the memory system.

FIG. 12 is a diagram illustrating another embodiment of the memory system.

Referring to FIG. 12, the memory system 30000 may be implemented as a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the memory device 1100. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad, a computer mouse, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100. Also, the memory controller 1200 may be implemented with the controller 1200 shown in FIG. 1.

Figure 13:
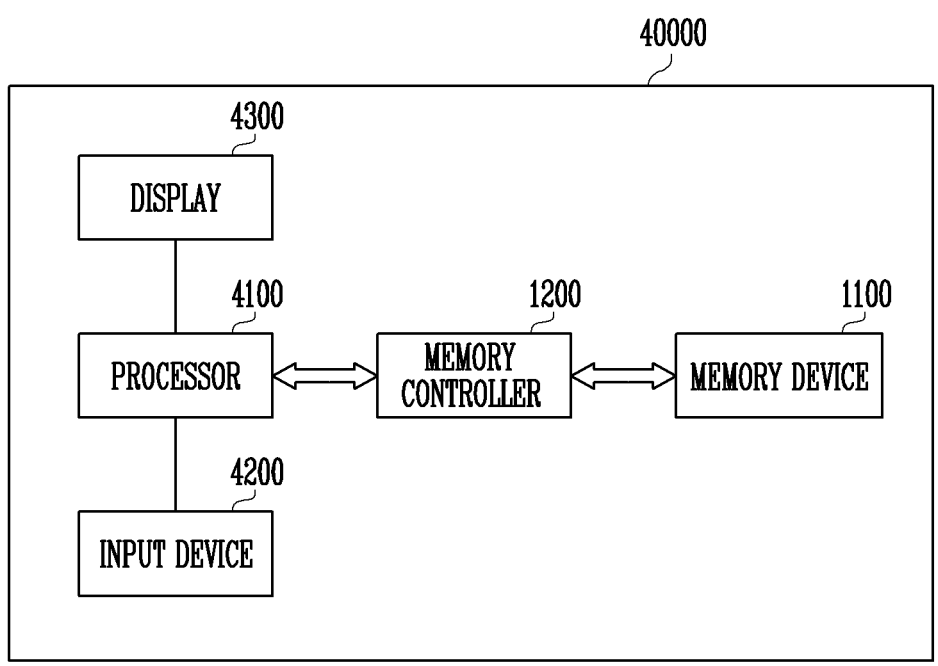
FIG. 13 is a diagram illustrating another embodiment of the memory system.

FIG. 13 is a diagram illustrating another embodiment of the memory system.

Referring to FIG. 13, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad, a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100. Also, the memory controller 1200 may be implemented with the controller 1200 shown in FIG. 1.

Figure 14:
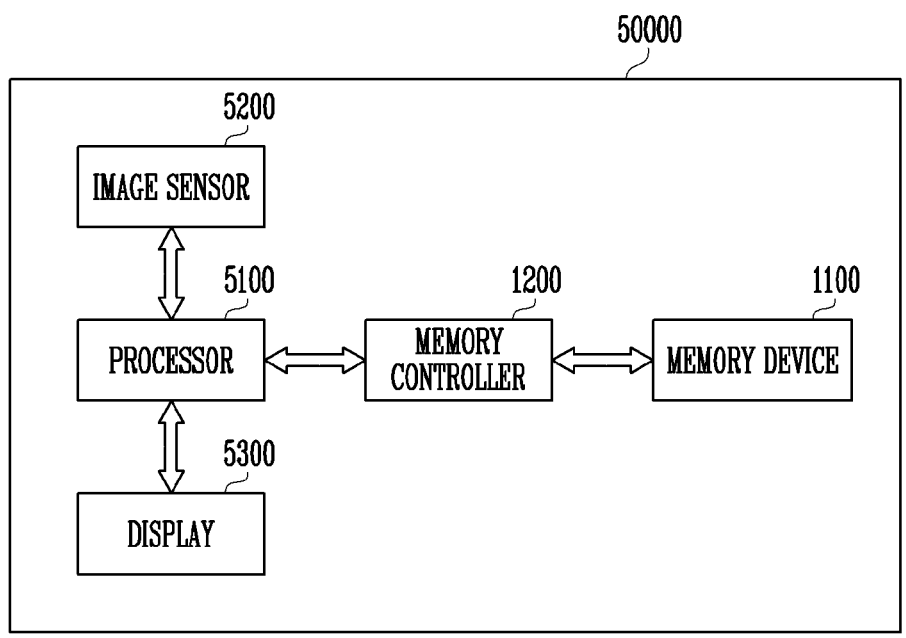
FIG. 14 is a diagram illustrating another embodiment of the memory system.

FIG. 14 is a diagram illustrating another embodiment of the memory system.

Referring to FIG. 14, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100. Also, the memory controller 1200 may be implemented with the controller shown in FIG. 1.

Figure 15:
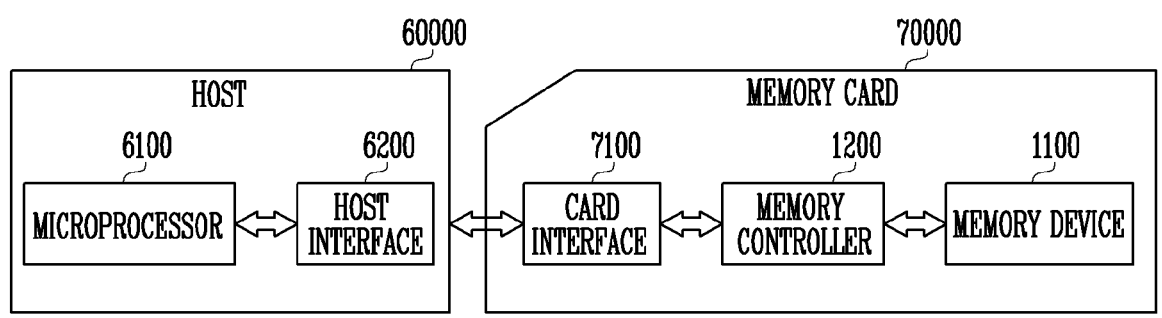
FIG. 15 is a diagram illustrating another embodiment of the memory system.

FIG. 15 is a diagram illustrating another embodiment of the memory system.

Referring to FIG. 15, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto. Also, the memory controller 1200 may be implemented with the controller 1200 shown in FIG. 1.

The card interface 7100 may interface data exchanged between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100.

In accordance with the present disclosure, an erase operation on memory cells corresponding to an erase state is performed after a program operation, so that the reliability of data can be improved.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all of the operations described may be selectively performed or part of the operations and may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor memory comprising:
a memory block including a plurality of pages;
a peripheral circuit configured to perform a program operation and an erase operation on a selected page among the plurality of pages; and
a control logic configured to control the peripheral circuit to perform the program operation and the erase operation based on data received from outside, the received data comprising erase state data corresponding to an erase state and program data corresponding to program states,
wherein the control logic controls the peripheral circuit:
to perform the program operation based on the program data in the received data; and
to decrease, after the program operation is completed, threshold voltages of selected memory cells corresponding to the erase state among a plurality of memory cells included in the selected page, wherein the selected memory cells are selected based on the erase state data in the received data, and
wherein, in the erase operation, the peripheral circuit applies a ground voltage to a selected word line corresponding to the selected page among a plurality of word lines of the memory block and floats remaining word lines among the plurality of word lines.

2. The semiconductor memory of claim 1, wherein the peripheral circuit programs the plurality of memory cells included in the selected page to the erase state and a plurality of program states in the program operation.

3. The semiconductor memory of claim 2,
wherein the peripheral circuit includes a plurality of page buffers coupled to bit lines of the memory block,
wherein each of the plurality of page buffers receives and temporarily stores the data to be programmed in the program operation.

4. The semiconductor memory of claim 3, wherein the plurality of page buffers apply an erase voltage to selected bit lines coupled to the memory cells corresponding to the erase state in the erase operation among the bit lines.

5. The semiconductor memory of claim 4, wherein the plurality of page buffers apply, based on the data temporarily stored in the page buffers in the program operation, the erase voltage to the selected bit lines and an erase inhibit voltage to remaining bit lines, among the plurality of bit lines.

6. The semiconductor memory of claim 5, wherein the erase inhibit voltage is a ground voltage.

7. The semiconductor memory of claim 5, wherein each of the plurality of page buffers includes:
a latch configured to receive and temporarily store the data in the program operation;
a switch control circuit configured to generate a switch control signal based on the data stored in the latch in the erase operation; and
a switch circuit configured to apply the erase voltage or the erase inhibit voltage to a corresponding bit line in response to the switch control signal.

8. The semiconductor memory of claim 4, wherein the peripheral circuit includes a voltage generating circuit configured to generate a program voltage and a pass voltage in the program operation and generate the erase voltage in the erase operation.

9. The semiconductor memory of claim 1,
wherein the plurality of memory cells included in the selected page has a threshold voltage distribution lower than a target threshold voltage before the program operation is performed,
wherein the memory cells corresponding to the erase state among the plurality of memory cells included in the selected page are erased to have a threshold voltage distribution lower than the target threshold voltage in the erase operation.

10. A method for operating a semiconductor memory, the method comprising:
receiving data from outside comprising erase state data corresponding to an erase state and program data corresponding to program states;
performing a program operation on a selected page among a plurality of pages based on the program data received from the outside; and
performing an erase operation of selectively erasing selected memory cells corresponding to the erase state among a plurality of memory cells included in the selected page,
wherein, in the performing of the erase operation, an erase voltage is applied to bit lines of the selected memory cells corresponding to the erase state, a ground voltage is applied to a selected word line corresponding to the selected page among a plurality of word lines, and remaining word lines among the plurality of word lines are floated,
wherein the selected memory cells are selected based on the erase state data received from the outside.

11. The method of claim 10, wherein, in the performing of the program operation, the plurality of memory cells included in the selected page are programmed to the erase state and a plurality of program states.

12. The method of claim 11,
wherein the plurality of memory cells have a first threshold voltage distribution before the program operation is performed,
wherein the first threshold voltage distribution is lower than a threshold voltage distribution of the erase state.

13. The method of claim 12, wherein, in the performing of the erase operation, a threshold voltage distribution of the selected memory cells is decreased to the first threshold voltage distribution.

14. A method for operating a semiconductor memory, the method comprising:
receiving data from outside comprising erase state data corresponding to an erase state and program data corresponding to program states and storing the received data in a plurality of page buffers;
controlling potential levels of a plurality of bit lines based on the data stored in the plurality of page buffers;
performing a program operation on a plurality of memory cells included in a selected page among a plurality of pages by applying a program voltage to a word line corresponding to the selected page; and
decreasing a threshold voltage distribution of memory cells corresponding to the erase state by applying an erase voltage to selected bit lines corresponding to selected memory cells corresponding to the erase state among a plurality of bit lines, applying a ground voltage to the word line corresponding to the selected page, and floating remaining word lines, wherein the selected memory cells are selected based on the erase state data received from the outside and stored in the plurality of page buffers.

15. The method of claim 14, wherein, in the decreasing of the threshold voltage distribution of the memory cells corresponding to the erase state, threshold voltages of memory cells corresponding to a plurality of program states are prevented from being decreased by applying an erase inhibit voltage to unselected bit lines corresponding to the memory cells corresponding to the plurality of program states among the plurality of bit lines based on the data stored in the plurality of page buffers.

* * * * *